(12) United States Patent
Formenti et al.

(10) Patent No.: US 11,536,773 B2
(45) Date of Patent: Dec. 27, 2022

(54) DIGITAL CORRECTION ALGORITHMS TO IMPROVE BATTERY VOLTAGE MEASUREMENT ACCURACY

(71) Applicant: Texas Instruments Incorporated, Dallas, TX (US)

(72) Inventors: Jose Antonio Vieira Formenti, Dallas, TX (US); Michael Szelong, Freising (DE); Takao Oshida, Plano, TX (US); Tobias Bernhard Fritz, Mainburg (DE); Vishnu Ravinuthula, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/389,415

(22) Filed: Jul. 30, 2021

(65) Prior Publication Data
US 2022/0187378 A1    Jun. 16, 2022

Related U.S. Application Data

(60) Provisional application No. 63/123,566, filed on Dec. 10, 2020.

(51) Int. Cl.
*G01R 31/374* (2019.01)
*G01L 1/22* (2006.01)
(Continued)

(52) U.S. Cl.
CPC .......... *G01R 31/374* (2019.01); *G01L 1/2281* (2013.01); *G01R 31/3835* (2019.01); *H03M 1/38* (2013.01)

(58) Field of Classification Search
None
See application file for complete search history.

(56) References Cited

U.S. PATENT DOCUMENTS 3,965,453 A   6/1976   Seidel et al.
3,994,010 A   11/1976  Geske
(Continued)

OTHER PUBLICATIONS

"Bq76PL455A—Cell Industrial Integrated Battery Monitor with Passive Cell Balancing" Texas Instruments, bq76PL455A, SLUSCL0A—Sep. 2016—Revised Oct. 2016, 127 pages.
(Continued)

*Primary Examiner* — Jas A Sanghera
(74) *Attorney, Agent, or Firm* — Michael A. Davis, Jr.; Frank D. Cimino

(57) ABSTRACT

An electronic device includes an ADC, a multiplexer, a voltage reference circuit, an analog circuit, and a digital circuit. The ADC has a signal input, a reference input, and an output. The multiplexer has signal inputs and a signal output coupled to the signal input of the ADC. The voltage reference circuit has an output coupled to the reference input of the ADC, a first strain sensor coupled to a first signal input of the multiplexer, a second strain sensor coupled to a second signal input of the multiplexer, and a temperature sensor. The analog circuit has an input coupled to a battery, and an output coupled to a fourth signal input of the multiplexer. The digital circuit is coupled to the output of the ADC and stores correction parameters for correcting a converted battery voltage value from the ADC.

20 Claims, 5 Drawing Sheets

(51) Int. Cl.
*G01R 31/3835* (2019.01)
*H03M 1/38* (2006.01)

(56) References Cited

U.S. PATENT DOCUMENTS

| | | | |
|---|---|---|---|
| 6,313,750 B1 * | 11/2001 | Lacy | G01R 31/396 340/636.15 |
| 10,352,792 B2 | 7/2019 | Nurmetov et al. | |
| 2020/0227408 A1 | 7/2020 | Szelong et al. | |

OTHER PUBLICATIONS

"BQ79616-Q1, BQ79614-Q1, BQ79612-Q1 Functional Safety-Compliant Automotive 16S/14S/12S Battery Monitor, Balancer and Integrated Hardware Protector" Texas Instruments, BQ79612-Q1, BQ79614-Q1, BQ79616-Q1, SLUSDS8C—Sep. 2019—Revised Jun. 2021, 12 pages.

"BQ79656-Q1, BQ79654-Q1, BQ79652-Q1 Functional Safety-Compliant Automotive 16S/14S/12S Battery Monitor, Balancerand Integrated Hardware Protector with Integrated Current Sense" Texas Instruments, BQ79656-Q1, SLUSEI2—May 2021, 11 pages.

Motz et al., "Wideband Continuous-time $\Sigma\Delta$ ADCs, Automotive Electronics, and Power Management", Chapter 16 Electrical Compensation of Mechanical Stress Drift in Precision Analog Circuits, Jan. 2017, pp. 297-326.

\* cited by examiner

DIGITAL CORRECTION ALGORITHMS TO IMPROVE BATTERY VOLTAGE MEASUREMENT ACCURACY

CROSS-REFERENCE TO RELATED APPLICATION

This application claims priority to, and the benefit of, U.S. provisional patent application No. 63/123,566, entitled "DIGITAL CORRECTION ALGORITHM TO IMPROVE BATTERY VOLTAGE MEASUREMENT ACCURACY", and filed on Dec. 10, 2020, the entirety of which is hereby incorporated by reference.

BACKGROUND

Battery cell voltage monitoring is used during operation and charging of cells in battery packs of electric vehicles (EV) and hybrid electric vehicles (HEV). Voltage sensing and digital conversion circuitry, however, may suffer from accuracy variations at different environmental conditions.

SUMMARY

In one aspect, an electronic device includes an analog to digital converter (ADC), a multiplexer, a voltage reference circuit, an analog circuit, and a digital circuit. The ADC has a signal input, a reference input, and an output. The multiplexer has signal inputs and a signal output coupled to the signal input of the ADC. The voltage reference circuit has an output coupled to the reference input of the ADC, a first strain sensor coupled to a first signal input of the multiplexer, a second strain sensor coupled to a second signal input of the multiplexer, and a temperature sensor. The analog circuit has an input coupled to a battery, and an output coupled to a fourth signal input of the multiplexer. The digital circuit is coupled to the output of the ADC and stores correction parameters for correcting a converted battery voltage value from the ADC.

In another aspect, a method includes, for a respective battery monitoring cycle: correcting a converted battery voltage value from an ADC to provide a common mode corrected value based on a common mode voltage correction parameter and a common mode correction equation of a voltage reference circuit; correcting the common mode corrected value to provide a temperature corrected value based on a converted temperature value associated with a temperature sensor of the voltage reference circuit, temperature correction parameters, and a temperature correction equation; and correcting the temperature corrected value to provide a corrected battery voltage value based on a first converted strain value associated with a first strain sensor of the voltage reference circuit, a second converted strain value associated with a second strain sensor of the voltage reference circuit, strain correction parameters, and a strain correction equation.

In a further aspect, a system includes a battery and a battery monitoring device. The battery monitoring device includes an ADC, a multiplexer, a voltage reference circuit, an analog circuit, such as an analog front end, and a digital circuit. The ADC has a signal input, a reference input, and an output. The multiplexer has signal inputs and a signal output coupled to a signal input of the ADC. The voltage reference circuit has an output, a first strain sensor, an orthogonal second strain sensor, and a temperature sensor. The output of the voltage reference circuit is coupled to the reference input of the ADC, the first strain sensor is coupled to a first signal input of the multiplexer, the second strain sensor is coupled to a second signal input of the multiplexer, and the temperature sensor is coupled to a third signal input of the multiplexer. The analog circuit has an input coupled to the battery, and an output coupled to a fourth signal input of the multiplexer. The digital circuit is coupled to the output of the ADC and stores correction parameters for correcting a converted battery voltage value from the ADC. The correction parameters include common mode voltage error correction parameters, temperature error correction parameters, and strain correction parameters associated with the first and second strain sensors.

DETAILED DESCRIPTION

Figure 1:
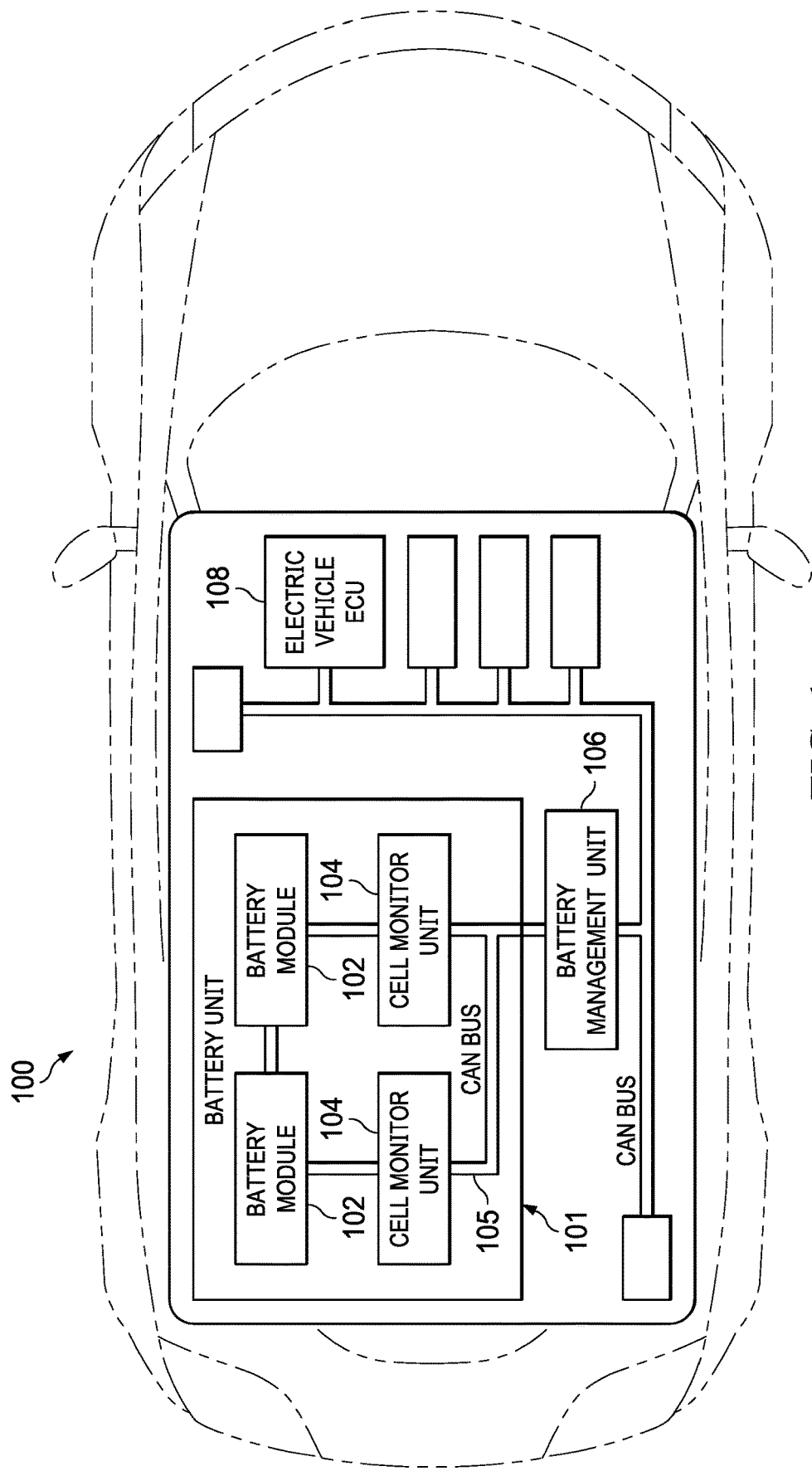
FIG. 1 is a system diagram of an electric vehicle with a battery and a battery monitoring electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
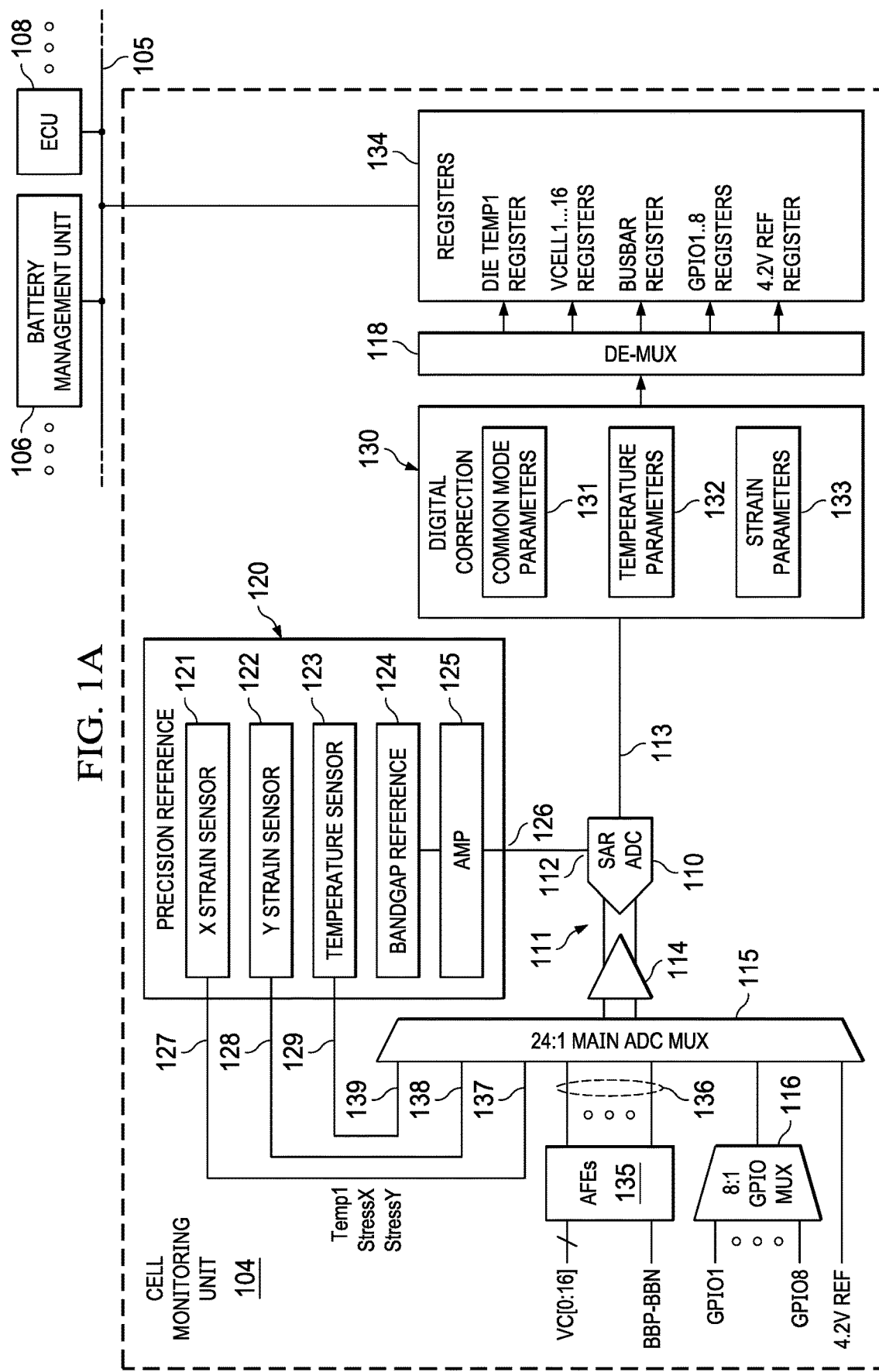
FIG. 1A is schematic diagram of further details of the electronic device of FIG. 1.
Figure 1B:
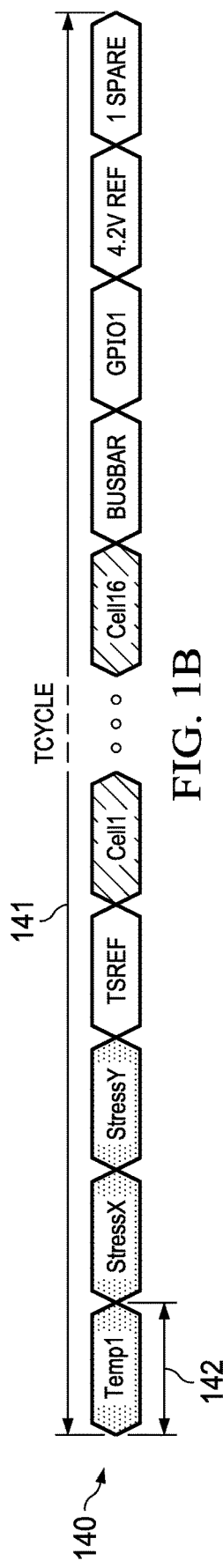
FIG. 1B is a schematic diagram of multiplexer channel selection samples in a battery monitoring cycle in the electronic device of FIGS. 1 and 1A.

Referring initially to FIGS. 1, 1A and 1B, FIG. 1 shows an electric vehicle system 100 with a battery unit 101 having a battery 102 (e.g., labeled BATTERY MODULE) and a battery monitoring electronic device 104 (e.g., labeled CELL MONITORING UNIT) per battery module. In the illustrated implementation, the battery unit 101 includes multiple batteries 102 and multiple respective battery monitoring electronic devices 104. In this implementation, moreover, the individual batteries 102 include multiple battery cells (not shown), which can be connected in any suitable series and/or parallel configuration. The electric vehicle system 100 further includes a communications bus 105 (e.g., labeled CAN BUS) that provides serial communications between the electronic devices 104, a battery management unit 106, and an electric vehicle engine control unit (ECU) 108. In operation, the battery management unit 106 communicates with the individual battery monitoring electronic devices 104 to receive battery cell voltage and other data. The battery management unit 106 in one example also implements battery cell balancing operations and battery charging operations, as well as other functions during operation of the electric vehicle system 100.

During operation of the vehicle system 100, as well as during battery charging operations, the battery monitoring electronic device 104 monitors battery cell voltages. As described further below in connection with FIG. 1A, the electronic device 104 includes sensing and digital conversion circuitry that have performance variations with environmental conditions including common mode voltages, temperature, and mechanical stress. In the illustrated system 100, the battery monitoring electronic device 104 includes memory registers accessible via the communications bus 105 by the battery management unit 106 and the electric vehicle ECU 108. The electronic device 104 senses and converts multiple battery cell voltage signals and digitally corrects converted voltage values based on digital correction parameters to compute corrected battery voltage values.

The electronic device 104 stores the corrected battery voltage values in the memory registers, and the battery management unit 106 and/or the ECU 108 can access the corrected battery voltage values via the communications bus 105 for use in performing a variety of functions including cell balancing, cell charging, and vehicle operation functions. In order to facilitate proper operation of the system 100, it is desirable to provide the corrected battery voltage values within a specified accuracy range, for example+/−4 mV (e.g., +/−5 sigma) across a temperature range associated with operation of the vehicle system 100, for example, −40° C. to +125° C. The sensing circuitry, including analog to digital conversion circuits and associated voltage reference circuitry (e.g., bandgap reference) includes transistors having junction temperatures Tj that affect operation and performance. In the illustrated example, the reference voltage output of a voltage reference circuit, such as a bandgap reference, is used as the voltage reference input for an ADC used to convert the battery cell voltage signals to converted battery voltage values.

Operation in a vehicle system 100 or other system having potentially large operating temperature ranges can cause temperature related variations in the reference voltage, which leads to variations in the converted values generated by the ADC. In addition, sensing circuitry and/or conversion circuitry in the electronic device 104 can be affected by common mode voltages during operation of the system 100. Also, mechanical strain (also referred to as strain herein) can affect the operation of the sensing and/or conversion circuitry of the electronic device 104. Certain of these effects can be characterized during manufacturing of the electronic device, such as common mode voltage affects and/or temperature affects. However, other performance variations, such as mechanical strain-related performance changes, may not be properly characterized prior to the electronic device 104 being manufactured and installed in the system 100 (e.g., the electronic device 104 being subjected to molding strain or other strain during packaging, the electronic device 104 being soldered to a printed circuit board (PCB), the PCB being installed in the vehicle, etc.). The reference voltage source for an ADC in a battery voltage monitoring application for vehicles or other systems ideally has a flat curvature versus temperature and little or no shift after the device is soldered down. Meeting these two requirements in an on-chip bandgap or other voltage reference circuit is difficult and analog compensation schemes are cumbersome and complex.

The system 100, electronic device 104, and methods described hereinafter provide digital correction of converted values with respect to common mode voltage, temperature and two-axis strain variations based on parameters stored in the electronic device 104 to provide an accurate post-solder bandgap reference or other voltage reference and conversion circuitry. In other implementations, the voltage reference circuitry can be trimmed with respect to flattening the associated temperature coefficient at wafer probe testing or even at final device testing during manufacturing, but this approach increases the cost of the electronic device. Moreover, the packaging/solder down/installation strain can affect the post-solder voltage reference temperature coefficient, and hence the ADC accuracy.

The illustrated examples advantageously remove temperature curvature digitally, and also digitally correct the converted values for common mode and strain-related effects. In operation, the electronic device 104 includes orthogonal first and second (e.g., X and Y-direction) strain sensors as well as a temperature sensor located proximate to the voltage reference circuitry, and the electronic device 104 measures real time strain and removes or corrects for the reference strain shift digitally. The electronic device 104 in one example also performs other functions in a vehicle battery monitoring application, such as measuring the temperature of the associated battery 102, measuring the battery cell voltages, detecting battery faults, and controlling or facilitating battery cell balancing.

FIG. 1A shows further details of the electronic device 104, which includes an ADC 110 (e.g., labeled SAR ADC). In one implementation, the electronic device 104 is or includes a packaged electronic device with one or more semiconductor dies and externally accessible leads or terminals that can be soldered or otherwise electrically connected to a host circuit, such as a PCB (not shown). In one example, the electronic device 104 includes a single semiconductor die that includes transistors, resistors, capacitors, and/or other electronic components that implement the described circuits. In another implementation, the electronic device 104 includes multiple semiconductor dies that each implement one or more of the illustrated and described circuits.

The ADC 110 has a signal input 111, a reference input 112, and an output 113. In one example, the ADC is a successive approximation register (e.g., SAR) ADC, but the design is not limited to the use of SAR ADCs and other implementations can use other architectures like DS ADCs. The signal input 111 of the ADC 110 in one example is a differential input as illustrated in FIG. 1A. In another implementation, the signal input of the ADC 110 is a single ended input (not shown). The illustrated example also includes a differential buffer amplifier 114 having a differential output coupled to the differential input 111 of the ADC 110. The buffer amplifier 114 in this example also includes a differential input coupled to an output of a multiplexer 115 (e.g., labeled 24:1 MAIN ADC MUX).

The multiplexer 115 has signal inputs and a signal output that is coupled to the differential input of the buffer amplifier 114. The signal output of the multiplexer 115 coupled through the buffer amplifier 114 to the signal input 111 of the ADC 110. In another implementation, the buffer amplifier 114 is omitted and the signal input 111 of the ADC 110 is coupled directly to the output of the multiplexer 115. The multiplexer 115 in one example is a 24-channel circuit that allows a single ADC 110 to convert signals from multiple signal sources, including a second multiplexer 116 (e.g., labeled 8:1 GPIO MUX) that is configured to selectively route general-purpose I/O (GPIO) signals (e.g., 8 GPIO signals labeled GPIO1 . . . GPIO8) to an input of the first multiplexer 115. The multiplexer 115 also includes further signal inputs to receive signals from strain sensors, a temperature sensor, and battery cell voltage signals via associated analog front end (AFE) circuits as described further below.

The output 113 of the ADC 110 in this example is coupled to an input of a digital circuit 130 and an output of the digital circuit 130 is coupled to an input of a demultiplexer circuit 118 (e.g., labeled De-MUX). The demultiplexer circuit 118 includes multiple outputs coupled to respective memory registers.

The electronic device 104 also includes a voltage reference circuit 120. In one example, the voltage reference circuit 120 is or includes a bandgap reference, although not required of all possible implementations. The voltage reference circuit 120 includes a first strain sensor 121 (e.g., a strain gauge), a second strain sensor 122 (e.g., a strain gauge), a temperature sensor 123 (e.g., thermocouple, resistive temperature device (RTD), etc.), a bandgap reference 124, and amplifier 125, and an output 126. The output 126 of the voltage reference circuit 120 is coupled to the reference input 112 of the ADC 110. The first strain sensor 121 (e.g., labeled X STRAIN SENSOR) is located proximate the bandgap reference 124 and is configured to measure a strain of the bandgap reference 124 along a first direction (e.g., X) of the semiconductor die of the bandgap reference 124. The first strain sensor 121 has an output 127 that provides a corresponding first strain signal that represents the strain along the first direction.

The second strain sensor 122 (e.g., labeled Y STRAIN SENSOR) is also located proximate the bandgap reference 124 and is configured to measure a strain of the bandgap reference 124 along a second direction (e.g., Y) of the semiconductor die of the bandgap reference 124, where the first and second directions are orthogonal to one another. The second strain sensor 122 has an output 128 that provides a corresponding second strain signal that represents the strain along the second direction. In one implementation, the first and second strain sensors 121, 122 include respective resistors that are arranged orthogonal to one another in the semiconductor die of the bandgap reference 124, and the individual sensors 121 and 122 include a resistive bridge circuit or other suitable sensing circuit (not shown) that provides an output signal at the respective output 127 or 128 that varies with a strain along the respective one of the first and second directions. In another example, the X-strain sensor signal is generated digitally from single strain sensitive components later in the signal path in the digital correction circuitry, and the same or similar generation is done for the Y-direction accordingly. The temperature sensor 123 (e.g., labeled TEMP. SENSOR) has an output 129 that provides a signal that represents the temperature of the bandgap reference 124 and of the whole die.

The digital circuit 130 (e.g., labeled DIGITAL CORRECTION) has an input coupled to the output 113 of the ADC 110. In operation, the digital circuit 130 performs digital correction and the demultiplexer 118 selectively provides a corrected value from the output of the digital circuit 130 to a respective one of the registers 134. In one implementation, the digital circuit 130 provides selection signals (not shown) to corresponding select inputs of the multiplexer's 115 and 116 and of the demultiplexer 118. The digital circuit 130 in one example is or includes a processor and associated electronic memory (e.g., a non-transitory computer readable medium, not shown). In this example, the electronic memory includes computer executable instructions which, when executed by the processor of the digital circuit 130, implement various functions described herein, including implementation of an example method to correct converted voltage values based on stored parameters 131-133 as described further below in connection with FIG. 2. The correction parameters include common mode voltage correction parameters 131, temperature correction parameters 132, and strain correction parameters 133 associated with the respective first and second strain sensors 121 and 122.

The electronic device 104 includes one or more memory registers 134 (e.g., labeled REGISTERS). In operation, the digital circuit 130 corrects a converted battery voltage value from the ADC 110 based on the correction parameters 131-133, and stores a corrected a corrected battery voltage value in a corresponding location of a memory register 134. In the illustrated example, the electronic device 104 includes multiple registers 134 that respectively store a die temperature value (e.g., stored in a register labeled Die Temp 1 register), multiple corrected battery voltage values (e.g., 16 values stored in registers labeled VCELL 1 ... 16 registers), a busbar voltage value (e.g., a value stored in a register labeled Busbar register), GPIO values (e.g., 8 values stored in registers labeled GPIO1 ... 8 registers), and a diagnostic reference voltage value independent of the ADC reference voltage (e.g., a value stored in a register labeled 4.2V REF register).

The electronic device 104 also includes an analog circuit 135 (e.g., labeled AFEs) having an input and an output. In the illustrated example, the analog circuit 135 includes multiple analog front end circuits, such as signal conditioning amplifier circuits, filter circuits, etc. (not shown) for each of multiple battery cell voltage sense inputs (e.g., 17 inputs labeled VC[0:16]) coupled to respective batteries 102 or cells thereof, and busbar positive and negative voltage sense inputs (e.g., labeled BBP-BBN). The multiplexer 115 has signal inputs 136, 137, 138 and 139. The output of the analog circuit 135 is coupled to a signal input 136 of the multiplexer 115. The output 127 of the first strain sensor 121 is coupled to a first signal input 137 of the multiplexer 115. The output 128 of the second strain sensor 122 is coupled to a second signal input 138 of the multiplexer 115. The output 129 of the temperature sensor 123 is coupled to a third signal input 139 of the multiplexer 115.

FIG. 1B shows multiplexer channel selection samples in a battery monitoring cycle 140 in the electronic device 104. The illustrated battery monitoring cycle 140 has a cycle time or duration 141 (e.g., labeled TCYCLE). The illustrated battery monitoring cycle 140 includes an integer number of sample clock cycles 142. In operation, the electronic device 104 provides continuous real-time strain-based ADC output compensation. In this example, the ADC 110 converts a temperature signal from the output 129 of the temperature sensor 123 by selecting the channel input 139 of the multiplexer 115 in a first sample time 142 (e.g., labeled Temp1) and provides a corresponding converted temperature value (Tj) associated with the temperature sensor 123 at the output 113 of the ADC 110. During the corresponding first sample time 142, the digital circuit 130 controls the selection input of the demultiplexer 118 to provide the corrected values to the respective memory registers 134 for use in correcting one or more converted battery voltage values subsequently sampled during the battery monitoring cycle 140.

Figure 2:
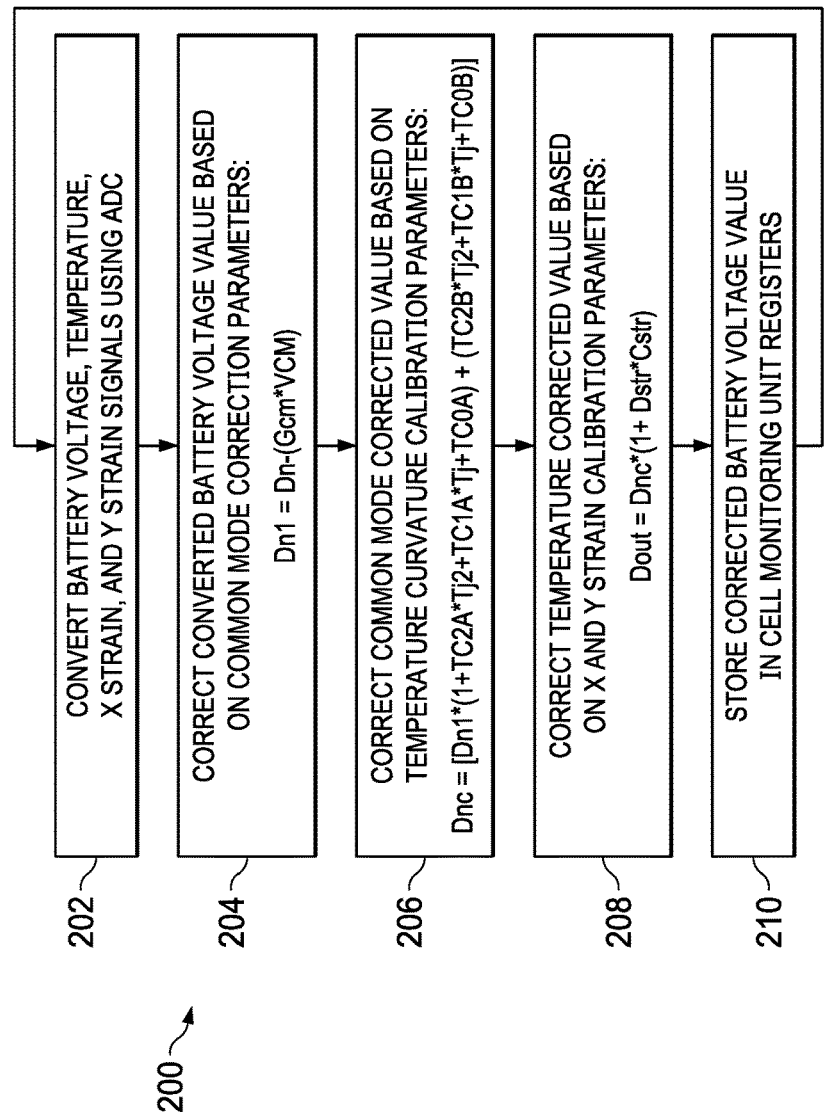
FIG. 2 is a flow diagram of a method.

Referring also to FIG. 2, the digital circuit 130 in one example is configured to implement a method 200 (e.g., by a processor of the digital circuit 130 executing computer executable instructions stored in a memory internal to, or operatively coupled to, the digital circuit 130). The method 200 illustrates a single battery monitoring cycle that is repeated for a generally continuous sequence of battery monitoring cycles 140 as shown in FIG. 1B. The method 200 begins at 202 with converting battery voltage, temperature, X strain, and Y strain signals using the ADC 110.

In operation, for respective battery monitoring cycles 140, the ADC 110 converts analog signals of the signal inputs 136, 137, 138, 139 of the multiplexer 115 and provides respective converted values at the output 113 of the ADC 110. In the example of FIGS. 1, 1A, and 1B, the ADC 110 first converts the junction temperature of the multiplexer input 139 and then the strain X and strain Y inputs. The ADC 110 converts a first stress signal from the first strain sensor 121 at the first signal input 137 of the multiplexer 115 in a subsequent sample time (e.g., labeled StressX), and then successively samples a second stress signal from the second strain sensor 122 (e.g., labeled StressY), and then samples another reference signal (e.g., labeled TSREF). Thereafter in the illustrated battery monitoring cycle 140, the ADC 110 successively samples the battery cell voltage signals from the respective multiplexer signal inputs 136 via the respective AFE circuits 135 (e.g., labeled Cell1 . . . Cell16). In this example, the ADC 110 thereafter sequentially samples a differential busbar voltage (e.g., labeled Busbar), a general-purpose I/O signal from the second multiplexer 116 (e.g., labeled GPIO1), the reference voltage value (e.g., labeled 4.2V REF), and the illustrated battery monitoring cycle includes a single spare sample time (e.g., labeled 1 Spare).

The voltage reference circuit 120 provides a reference voltage signal at the output 126. The ADC 110 receives the reference voltage signal at the reference input 112 and the analog to digital conversions performed by the ADC 110 are scaled according to the reference voltage signal. In the illustrated example, the bandgap reference 124 provides an output signal to the amplifier 125. The output of the amplifier 125 is coupled to the output 126 of the voltage reference circuit 120, and the amplifier generates the reference voltage signal provided to the ADC 110. In operation in the illustrated battery monitoring cycle 140, the digital circuit 130 implements a continuous real-time sequence of battery monitoring cycles 140 to perform continuous strain-based ADC output compensation. The ADC 110 in this example converts 16 different cell voltage channels, and the converted values are corrected based on the junction temperature Tj and the converted X and Y direction strain values. In respective battery monitoring cycles 140, the digital circuit 130 stores the converted values internally, and uses these values along with the correction parameters 131-133 and associated equations or formulas (e.g., parametric and/or lookup tables) to digitally correct the initial converted battery voltage value or values from the ADC 110 and to compute and store corresponding corrected battery voltage values based on digital stress sensor X/Y outputs and the converted temperature value Tj.

Figure 3:
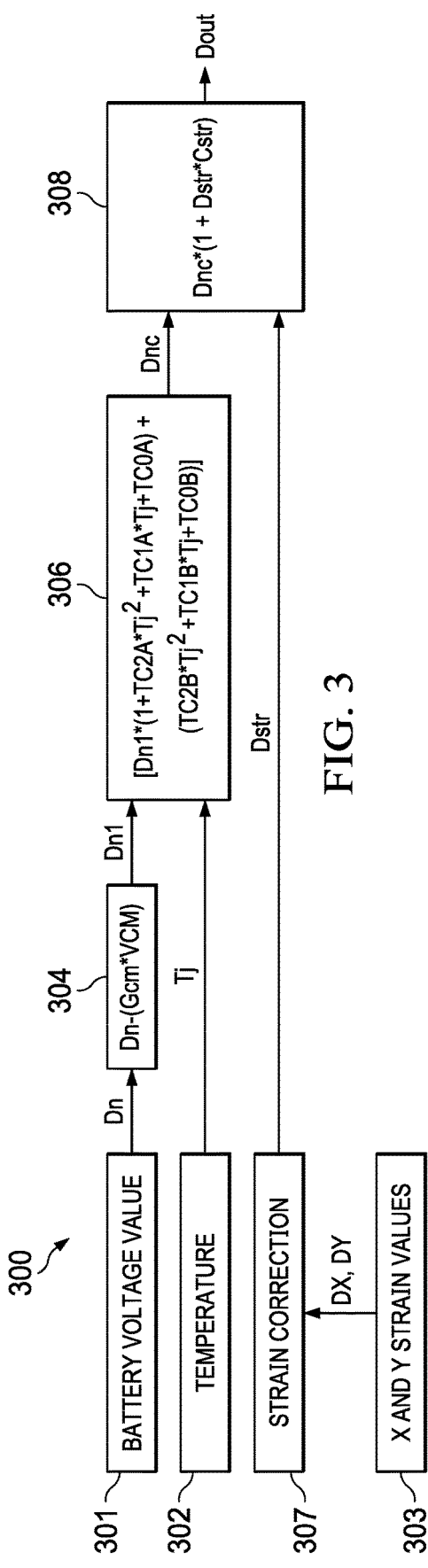
FIG. 3 is a schematic diagram of dataflow in battery voltage value correction for common mode voltage, temperature, and strain.
Figure 5:
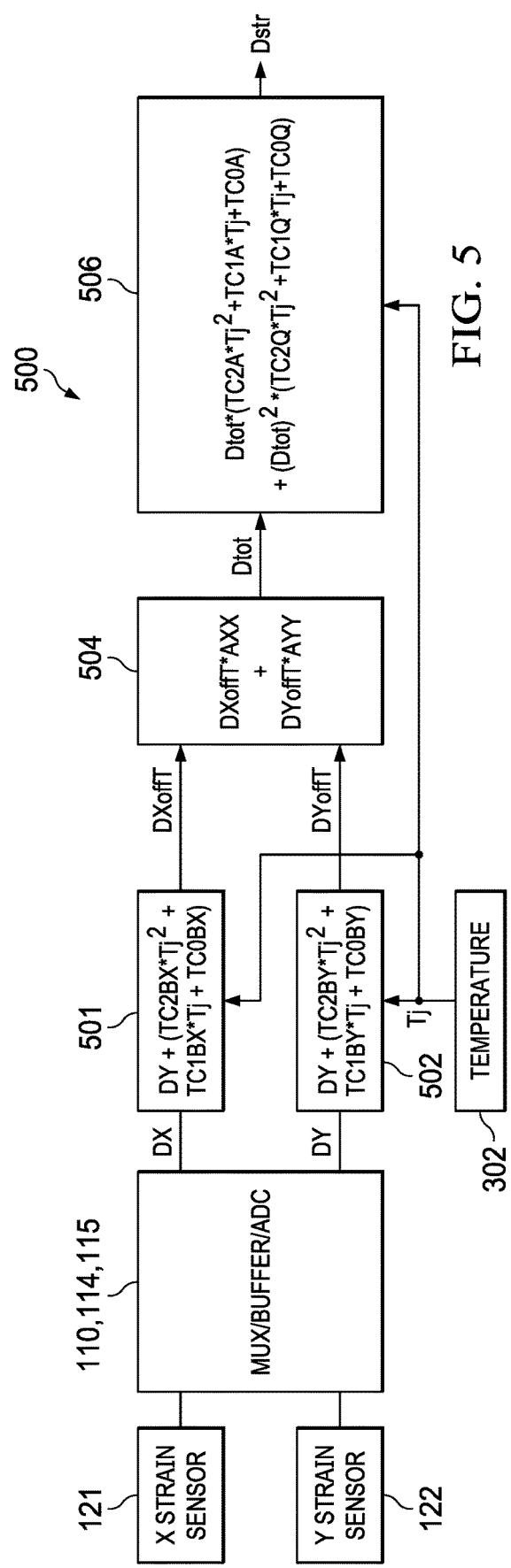
FIG. 5 is a schematic diagram of dataflow in battery voltage value correction for strain.

FIG. 3 shows an example dataflow 300 in battery voltage value digital correction for common mode voltage, temperature, and strain in one implementation of the electronic device 104. The ADC 110 provides a converted battery voltage value 301 (Dn) and a converted temperature value 302 (Tj), as well as converted X and Y strain values 303 (DX and DY) in a respective battery monitoring cycle 140. The digital circuit 130 performs various computations in one example by implementing a common mode correction equation 304, a gain and offset temperature curvature correction equation 306, a strain correction component 307, and a strain correction equation 308, as described further below in connection with the method 200 of FIG. 2. FIG. 5 below illustrates an example implementation of the strain correction component 307 of FIG. 3. As illustrated in the dataflow 300, the digital circuit 130 removes common mode related gain errors of the analog circuit 135 based on the common mode correction equation 304 and removes ADC output error due to reference curvature using stored parameters determined during wafer probe testing based on the temperature correction equation 306. In addition, the digital circuit 130 digitally removes strain induced gain error based on the strain correction equation 308. In one example, the ADC channel/gain compensation is based on parameters calculated by automatic test equipment (CTE) at final testing of the electronic device 104 using second order gain and offset curve fitting computations based on three temperatures, and based on a 2× input voltage (VIN) error measured at wafer probe testing during fabrication of the electronic device 104.

The method 200 of FIG. 2 continues for a respective battery monitoring cycle 140 at 204 with correcting the converted battery voltage value Dn from the ADC 110. At 204 in one example, the digital circuit 130 provides a common mode corrected value Dn1 based on a common mode voltage correction parameter 131 and a common mode gain correction equation 304 of the voltage reference circuit 120. At 206 for the respective battery monitoring cycle 140, the method 200 further includes correcting the common mode corrected value Dn1 to provide a temperature corrected value Dnc based on the converted temperature value Tj associated with the temperature sensor 123 of the voltage reference circuit 120, gain and offset temperature coefficient correction parameters 132, and the gain and offset temperature curvature correction equation 306. At 208 for the respective battery monitoring cycle 140, the method 200 further includes correcting the temperature corrected value Dnc to provide a corrected battery voltage value Dout based on the first converted strain value DX associated with the first strain sensor 121 of the voltage reference circuit 120, the second converted strain value DY associated with the second strain sensor 122 of the voltage reference circuit 120, the strain correction parameters 133, the converted temperature value Tj associated with the temperature sensor 123, and the strain correction equation 308. The method 200 also includes storing the corrected battery voltage value Dout in a register 134 at 210. Thereafter, the digital circuit 130 implements further battery monitoring cycles 140 at 202, 204, 206, 208, and 210 as described above.

In the example of FIG. 3, the common mode voltage correction parameter 131 includes a common mode gain value Gcm and a common mode voltage value VCM of a common mode correction equation 304 (e.g., Dn1=Dn−(Gcm*VCM)). The digital circuit 130 corrects the converted battery voltage value Dn (e.g., at 204 in FIG. 2) for the respective battery monitoring cycle 140 by computing the common mode corrected value Dn1 based on the converted battery voltage value Dn using the common mode gain value Gcm, the common mode voltage value VCM, and the common mode correction equation 304.

The temperature correction parameters 132 in this example include a set of gain and offset curvature vs. temperature correction parameters TC2A, TC1A, TC0A, TC2B, TC1B and TC0B of a second order correction equation 306 (e.g., Dnc=[Dn1*((1+TC2A*Tj$^2$+TC1A*Tj+TC0A)+(TC2B*Tj$^2$+TC1B*Tj+TC0B)]). In another implementation a third or higher order correction equation is used. The digital circuit 130 corrects the common mode corrected value Dn1 (e.g., at 206 in FIG. 2) for the respective battery monitoring cycle 140, by computing the curvature corrected value Dnc based on the converted temperature value Tj and the common mode corrected value Dn1 using the set of gain and offset curvature correction parameters TC2A, TC1A, TC0A, TC2B, TC1B and TC0B and the gain and offset temperature curvature correction equation 306.

The strain correction parameters 133 in this example include a strain correction constant Cstr (also labeled "$C_{STR}$" herein) of a strain correction equation 308 (e.g., Dout=Dnc*(1+Dstr*Cstr)). The digital circuit 130 computes a temperature corrected strain value Dstr (also labeled "$D_{STR}$" herein, e.g., the strain correction 307 in FIG. 3) based on the first converted strain value DX and the second converted strain value DY (e.g., at 208 in FIG. 2). The digital circuit 130 computes the corrected battery voltage value Dout (e.g., also at 208 in FIG. 2) for the respective battery monitoring cycle 140, based on the temperature corrected value Dnc using the temperature corrected strain value Dstr, the strain correction constant Cstr, and the strain correction equation 308.

Figure 4:
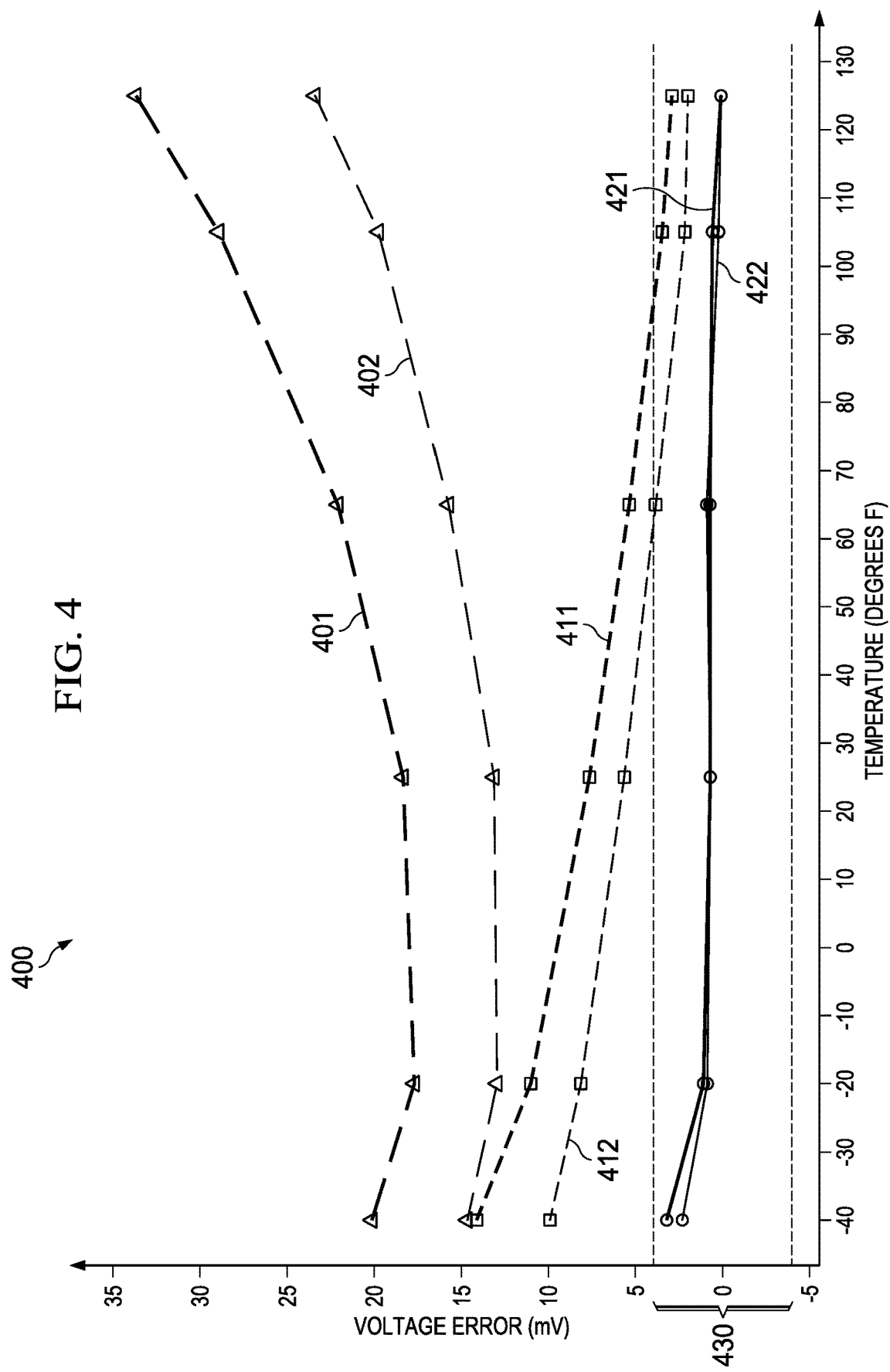
FIG. 4 is a graph of voltage error at different stages of a digital correction flow as a function of temperature.

FIG. 4 shows a graph 400 of voltage error as a function of temperature for two examples of the converted battery voltage value Dn before and after correction by the digital circuit 130. Curves 401 and 402 in FIG. 4 show the voltage error of the uncorrected converted battery voltage value Dn from the ADC 110 for respective first and second examples. Prior to digital correction, the curves 401 and 402 exhibit raw ADC error of 36 mV (e.g., 0.86%). The curves 401 and 402 illustrate the raw ADC output error that exhibits common mode voltage dependency (e.g., approximately 4.5 mV/V), which is attributed to the AFE analog circuit 135 (FIG. 1A), which cannot be calibrated out by temp compensation and strain calibration alone. The curves 401 and 402 show common mode gain error, gain and offset curvature vs. temperature, and a shift in the voltage reference due to strain. Additional common mode calibration (e.g., equation 304 in FIG. 3, 204 in FIG. 2) mitigates the common mode voltage dependency.

Curves 411 and 412 in FIG. 4 show the voltage errors reduced by temperature correction (e.g., equation 306 in FIG. 3, 206 in FIG. 2) for the respective first and second examples. The curves 411 and 412 exhibit voltage errors of 15 mV (e.g., 0.36%). Curves 421 and 422 show the voltage errors for the respective first and second examples reduced by further correction for strain (e.g., equation 308 in FIG. 3, 208 in FIG. 2). The curves 421 and 422 exhibit voltage errors of approximately 3.3 mV (e.g., 0.08%). The corrections bring the voltage error curves 421 and 422 within an acceptance range 430.

FIG. 5 shows an example digital correction dataflow 500 in battery voltage value correction for strain in an implementation of the strain correction component 307 in FIG. 3 by the electronic device 104. The multiplexer 115, buffer amplifier 114 and ADC 110 provide the first and second strain values DX and DY associated with the respective first and second strain sensors 121 and 122 of the voltage reference circuit 120 as raw digital data to the digital circuit 130 in a respective battery monitoring cycle 140. The ADC 110 also provides the converted temperature value 302 (Tj) in the respective battery monitoring cycle 140. The digital circuit 130 performs various computations in this example by implementing a first strain temperature offset equation 501, a second strain temperature offset equation 502, a weighted average equation 504, and a third strain temperature offset equation 506 (e.g., a strain temperature gain equation) of second or higher order. The first and second strain temperature offset equations 501 and 502 are of second or higher order in one implementation.

The strain correction parameters 133 in this example include a first set of strain correction parameters TC2BX, TC1BX, and TC0BX of the first strain temperature offset equation 501 to compute a first strain offset value DXoffT (e.g., DXoffT=DX+(TC2BX*$Tj^2$+TC1BX*Tj+TC0BX)). The strain correction parameters 133 also include a second set of strain correction parameters TC2BY, TC1BY, and TC0BY of the second strain temperature offset equation 502 to compute a second strain offset value DYoffT (e.g., DYoffT=DY+(TC2BY*$Tj^2$+TC1BY*Tj+TC0BY)). The first and second sets of strain correction parameters in one example represent a second order AFE analog offset. The first and second sets of strain correction parameters are calculated by automatic test equipment (CTE) at final testing of the electronic device 104 using curve fitting computations based on temperature probe data from three temperature probes after zero strain trimming.

The strain correction parameters 133 in this example also include a set of weighting parameters AXX and AYY of the weighted average equation 504 for computing a combined strain value Dtot (e.g., Dtot=DXoffT*AXX+DYoffT*AYY). In one example, the weighting parameters AXX and AYY are determined according to respective X and Y direction dimensions and form factor of an NPN transistor of the bandgap reference 124 (FIG. 1). In addition, the strain correction parameters 133 include a third set of strain correction parameters TC2A, TC1A, TC0A, TC2Q, TC1Q, and TC0Q of the third strain temperature offset equation 506 (e.g., strain temperature gain equation) to linearize and calibrate strain measurement errors of the sensors 121 and 122 for strain vs. temperature by computing the temperature corrected strain value Dstr (e.g., Dstr=Dtot*(TC2A*$Tj^2$+TC1A*Tj+TC0A)+$(Dtot)^2$*(TC2Q*$Tj^2$+TC1Q*Tj+TC0Q)). In another implementation one or more of the strain temperature offset equations 501, 502 and 506 can be of third or higher order.

For the digital strain correction in this example, the digital circuit 130 computes the first strain offset value DXoffT for the respective battery monitoring cycle 140 based on the first converted strain value DX and the converted temperature value Tj using the first set of strain correction parameters TC2BX, TC1BX, TC0BX and the first strain temperature offset equation 501. This correction removes the zero-strain temperature offset f1 (Tj) of the first strain sensor 121 determined at wafer probe testing or at final test. The digital circuit 130 computes the second strain offset value DYoffT based on the second converted strain value DY and the converted temperature value Tj using the second set of strain correction parameters TC2BY, TC1BY, TC0BY and the second strain temperature offset equation 502. This correction removes the zero-strain temperature offset f2 (Tj) of the second strain sensor 122 determined at wafer probe testing or at final test.

The digital circuit 130 computes the total stress value Dtot for the respective battery monitoring cycle 140 based on the first and second strain offset values DXoffT and DYoffT using the set of weighting parameters AXX and AYY and the weighted average equation 504. This facilitates strain correction that is proportional to the strain directional sensitivity of the voltage reference circuit 120. The digital circuit 130 computes the temperature corrected strain value Dstr for the respective battery monitoring cycle 140 based on the total stress value Dtot using the third set of strain correction parameters TC2A, TC1A, TC0A, TC2Q, TC1Q and TC0Q and the third strain temperature offset equation 506 (e.g., strain temperature gain equation). This facilitates removal of strain sensor linear and quadratic gain error as a function of temperature.

The digital circuit 130 in this example corrects the temperature corrected value Dnc (e.g., 308 in FIG. 3, 208 in FIG. 2) for the respective battery monitoring cycle 140 by computing the corrected battery voltage value Dout based on the temperature corrected value Dnc, the temperature corrected strain value Dstr, and the converted temperature value Tj.

The electronic device in one example is configured by storing the correction parameters 131-133 and associated equations or formulas (e.g., parametric and/or lookup tables along with computer executable instructions) during fabrication, for example, at final testing of the packaged electronic device. In various implementations, some, or all the correction parameters 131-133 can be determined (e.g., calculated) at wafer probe testing or at final device testing, and some can alternatively be determined empirically.

The electronic device 104 digitally corrects the converted battery voltage value(s) Dn for respective battery monitoring cycles 140 in system operation to compensate for temperature and other environmental effects based on compressive and tensile strain sensors 121 and 122 to correct strain effects that may result from molding the semiconductor die into a package structure, soldering of the electronic device 104 onto a PCB, and/or strain from installation or use of the electronic device in the system 100. The combination of the orthogonally disposed strain sensors 121 and 122 and digital correction with weighting of the X and Y strain sensor outputs to generate a single strain value provides flexibility of applying the correction parameters and equations for different NPN bandgap reference transistor designs or precision voltage reference dimensions or other circuits where it is desirable to mitigate or avoid drift due to strain. In one implementation, package and/or solder down data is used as stress calibration points to improve the accuracy of the digital correction by setting the parameters 133 based on empirical data. The electronic device 104 digitally corrects the final ADC output for probe voltage reference (e.g., bandgap) curvature non-idealities, analog front-end errors, strain-based reference shift seen due to packaging and solder, and temperature. Digital correction provides high flexibility, helps apply high precision second order gain and offset temperature correction to the ADC digital output.

The digitally corrected ADC output in one example has a least significant bit (LSB) size $\Delta$ given by the following equation (1):

$$LSB \text{ size of } ADC = \Delta = \frac{V_{FS}}{2^N} \quad (1)$$

The digital output of the ADC 110 for a particular input voltage $V_{IN}$ is given by the following equation (2):

$$\frac{V_{IN}}{\Delta} = \frac{2^N * V_{IN}}{V_{FS}}, \quad (2)$$

where $V_{FS}$ is determined based on a reference voltage $V_{REF}$ at the reference input 112 of the ADC 110. After digital correction at a given temperature Tj, the digital output of the ADC 110 for a particular input voltage $V_{IN}$ is given by the following equation (3):

$$\frac{V_{IN}}{\Delta} = \frac{2^N * V_{IN}}{V_{REF}} (1 + D_{STR} C_{STR}) \quad (3)$$

$D_{STR}=0$ at wafer probe testing because there is no strain, and the constant value Cstr (also labeled "$C_{STR}$" herein) in one example is determined empirically, for example, by test chip characterization. However, the voltage reference circuit 120 generally has a finite non-zero strain after the electronic device 104 is soldered down to a host PCB. In one implementation, irrespective of the reference voltage shift due to strain, the digital output of ADC at probe substantially equals the digital output of ADC post-solder, due to the strain gauge sensors 121, 122, and the following equations (4), (5), and (6) are used to characterize Cstr:

$$\frac{2^N * V_{IN}}{V_{REF\_PROBE}} (1 + D_{STR-PROBE} C_{STR}) = \quad (4)$$

$$\frac{2^N * VIN}{V_{REF\_SOLDER}} (1 + D_{STR-SOLDER} C_{STR})$$

$$\frac{2^N * NIN}{V_{REF}} (1 + 0 * C_{STR}) = \frac{2^N * VIN}{V_{REF} - \Delta V_{REF}} (1 + D_{STR} C_{STR}) \quad (5)$$

$$\frac{V_{REF} - \Delta V_{REF}}{V_{REF}} = (1 + D_{STR} C_{STR}) \Rightarrow \frac{\Delta V_{REF}}{V_{REF}} = D_{STR} C_{STR} \quad (6)$$

In one example $C_{STR}$ is selected based on a 30-unit solder down characterization at room temperature. The described system, electronic device 100 and method 200 provide a digital correction scheme that compensates for the post-solder bandgap or other voltage reference curvature change, and in one implementation achieve a target+/−4 mV ADC accuracy (e.g., range 430 in FIG. 4). The correction scheme uses the outputs of compressive and tensile strain sensors placed next to the bandgap, and digitally compensates the ADC output. This solution provides technical advantages compared to other techniques to address sources of error such as non-flat bandgap voltage reference curvature vs temperature, and bandgap voltage reference output value shift after the device is soldered down. Instead, the electronic device 104 implements digital correction algorithms that facilitate flattening the resultant ADC output curvature vs temperature at probe, monitoring digital outputs of an analog strain gauge to continuously detect strain seen by the on-chip voltage reference due to package/solder down effects, and compensating the ADC output directly across temperature in the digital domain. The described examples provide flexibility to perform second or higher order offset and gain correction versus temperature of the ADC output at wafer probe testing where the voltage reference sees no stress, and to linearize the digital output of the analog strain sensors 121 and 122 versus temperature and use that to compensate for ADC output error due to package/solder strain seen by the voltage reference.

Modifications are possible in the described examples, and other implementations are possible, within the scope of the claims.

What is claimed is:

1. An electronic device, comprising:
an analog to digital converter (ADC) having a signal input, a reference input, and an output;
a multiplexer having signal inputs and a signal output, the signal output of the multiplexer coupled to the signal input of the ADC;
a voltage reference circuit having an output, a first strain sensor, a second strain sensor, and a temperature sensor, the output of the voltage reference circuit coupled to the reference input of the ADC, the first strain sensor coupled to a first signal input of the multiplexer, the second strain sensor coupled to a second signal input of the multiplexer, the first and second strain sensors orthogonal to one another, and the temperature sensor coupled to a third signal input of the multiplexer;

an analog circuit having an input and an output, the input of the analog circuit coupled to a battery, and the output of the analog circuit coupled to a fourth signal input of the multiplexer; and a digital circuit coupled to the output of the ADC, the digital circuit stores correction parameters for correcting a converted battery voltage value from the ADC, the correction parameters including common mode voltage correction parameters, temperature correction parameters, and strain correction parameters associated with the first and second strain sensors.

2. The electronic device of claim 1, wherein:

the ADC is configured to: for respective battery monitoring cycles, convert analog signals of the signal inputs of the multiplexer and provide respective converted values at the output of the ADC; and the digital circuit is configured to: for a respective battery monitoring cycle, compute a corrected battery voltage value based on the converted battery voltage value, a first converted strain value associated with the first strain sensor, a second converted strain value associated with the second strain sensor, and a converted temperature value associated with the temperature sensor.

3. The electronic device of claim 2, wherein:

the strain correction parameters include: a first set of strain correction parameters of a first strain temperature offset equation of second or higher order, a second set of strain correction parameters of a second strain temperature offset equation of second or higher order, a set of weighting parameters of a weighted average equation, and a third set of strain correction parameters of a third strain temperature offset equation of second or higher order; and the digital circuit is configured to, for the respective battery monitoring cycle:

compute a first strain offset value based on the first converted strain value and the converted temperature value using the first set of strain correction parameters and the first strain temperature offset equation, compute a second strain offset value based on the second converted strain value and the converted temperature value using the second set of strain correction parameters and the second strain temperature offset equation, compute a total stress value based on the first and second strain offset values using the set of weighting parameters and the weighted average equation, compute a temperature corrected strain value based on the total stress value using the third set of strain correction parameters and the third strain temperature offset equation, and compute the corrected battery voltage value based on the converted battery voltage value, the temperature corrected strain value, and the converted temperature value.

4. The electronic device of claim 3, wherein:

the common mode voltage correction parameters include a common mode gain value and a common mode voltage value of a common mode correction equation;

the temperature correction parameters include a set of temperature correction parameters of a temperature correction equation of second or higher order;

the strain correction parameters include a strain correction constant of a strain correction equation; and the digital circuit is configured to, for the respective battery monitoring cycle:

compute a common mode corrected value based on the converted battery voltage value using the common mode gain value, the common mode voltage value, and the common mode correction equation, compute a temperature corrected value based on the converted temperature value and the common mode corrected value using the set of temperature correction parameters and the temperature correction equation, and compute the corrected battery voltage value based on the temperature corrected value using the temperature corrected strain value, the strain correction constant, and the strain correction equation.

5. The electronic device of claim 2, wherein:

the common mode voltage correction parameters include a common mode gain value and a common mode voltage value of a common mode correction equation;

the temperature correction parameters include a set of temperature correction parameters of a temperature correction equation of second or higher order;

the strain correction parameters include a strain correction constant of a strain correction equation; and the digital circuit is configured to, for the respective battery monitoring cycle:

compute a common mode corrected value based on the converted battery voltage value using the common mode gain value, the common mode voltage value, and the common mode correction equation, compute a temperature corrected value based on the converted temperature value and the common mode corrected value using the set of temperature correction parameters and the temperature correction equation, compute a temperature corrected strain value based on the first converted strain value and the second converted strain value, and compute the corrected battery voltage value based on the temperature corrected value using the temperature corrected strain value, the strain correction constant, and the strain correction equation.

6. The electronic device of claim 2, wherein the digital circuit is configured to, for the respective battery monitoring cycle, compute a temperature corrected strain value based on the first converted strain value and the second converted strain value using a weighted average equation.

7. The electronic device of claim 1, wherein the digital circuit is configured to, for a respective battery monitoring cycle, compute a temperature corrected strain value based on a first converted strain value associated with the first strain sensor and a second converted strain value associated with the second strain sensor using a weighted average equation.

8. The electronic device of claim 1, wherein the voltage reference circuit includes a bandgap reference.

9. A method, comprising:

for a respective battery monitoring cycle, correcting a converted battery voltage value from an analog to digital converter (ADC) to provide a common mode corrected value based on a common mode voltage correction parameter and a common mode correction equation of a voltage reference circuit;

for the respective battery monitoring cycle, correcting the common mode corrected value to provide a temperature corrected value based on a converted temperature value associated with a temperature sensor of the voltage reference circuit, temperature correction parameters, and a temperature correction equation; and for the respective battery monitoring cycle, correcting the temperature corrected value to provide a corrected battery voltage value based on a first converted strain value associated with a first strain sensor of the voltage reference circuit, a second converted strain value associated with a second strain sensor of the voltage reference circuit, strain correction parameters, and a strain correction equation.

10. The method of claim 9, wherein:

the strain correction parameters include: a first set of strain correction parameters of a first strain temperature offset equation of second or higher order, a second set of strain correction parameters of second strain temperature offset equation of second or higher order, a set of weighting parameters of a weighted average equation, and a third set of strain correction parameters of a third strain temperature offset equation of second or higher order;

correcting the temperature corrected value comprises, for the respective battery monitoring cycle:
  computing a first strain offset value based on the first converted strain value and the converted temperature value using the first set of strain correction parameters and the first strain temperature offset equation,
  computing a second strain offset value based on the second converted strain value and the converted temperature value using the second set of strain correction parameters and the second strain temperature offset equation,
  computing a total stress value based on the first and second strain offset values using the set of weighting parameters and the weighted average equation, and
  computing a temperature corrected strain value based on the total stress value using the third set of strain correction parameters and the third strain temperature offset equation; and correcting the temperature corrected value comprises, for the respective battery monitoring cycle, computing the corrected battery voltage value based on the temperature corrected value, the temperature corrected strain value, and the converted temperature value.

11. The method of claim 10, wherein:

the common mode voltage correction parameter includes a common mode gain value and a common mode voltage value of a common mode correction equation;

the temperature correction parameters include a set of temperature correction parameters of a temperature correction equation of second or higher order;

the strain correction parameters include a strain correction constant of a strain correction equation;

correcting the converted battery voltage value comprises, for the respective battery monitoring cycle, computing a common mode corrected value based on the converted battery voltage value using the common mode gain value, the common mode voltage value, and the common mode correction equation;

correcting the common mode corrected value comprises, for the respective battery monitoring cycle, computing a temperature corrected value based on the converted temperature value and the common mode corrected value using the set of temperature correction parameters and the temperature correction equation; and correcting the temperature corrected value comprises, for the respective battery monitoring cycle, computing the corrected battery voltage value based on the temperature corrected value using the temperature corrected strain value, the strain correction constant, and the strain correction equation.

12. The method of claim 11, further comprising, for the respective battery monitoring cycle, storing the corrected battery voltage value in a register.

13. The method of claim 9, wherein:

the common mode voltage correction parameter includes a common mode gain value and a common mode voltage value of a common mode correction equation;

the temperature correction parameters include a set of temperature correction parameters of a temperature correction equation of second or higher order;

the strain correction parameters include a strain correction constant of a strain correction equation;

correcting the converted battery voltage value comprises, for the respective battery monitoring cycle, computing a common mode corrected value based on the converted battery voltage value using the common mode gain value, the common mode voltage value, and the common mode correction equation;

correcting the common mode corrected value comprises, for the respective battery monitoring cycle, computing a temperature corrected value based on the converted temperature value and the common mode corrected value using the set of temperature correction parameters and the temperature correction equation; and correcting the temperature corrected value comprises, for the respective battery monitoring cycle:
  computing a temperature corrected strain value based on the first converted strain value and the second converted strain value, and
  computing the corrected battery voltage value based on the temperature corrected value using the temperature corrected strain value, the strain correction constant, and the strain correction equation.

14. The method of claim 9, further comprising, for the respective battery monitoring cycle, storing the corrected battery voltage value in a register.

15. A system, comprising:

a battery; and a battery monitoring device, comprising:
  an analog to digital converter (ADC) having a signal input, a reference input, and an output;
  a multiplexer having signal inputs and a signal output, the signal output of the multiplexer coupled to the signal input of the ADC;
  a voltage reference circuit having an output, a first strain sensor, a second strain sensor, and a temperature sensor, the output of the voltage reference circuit coupled to the reference input of the ADC, the first strain sensor coupled to a first signal input of the multiplexer, the second strain sensor coupled to a second signal input of the multiplexer, the first and second strain sensors orthogonal to one another, and the temperature sensor coupled to a third signal input of the multiplexer;
  an analog circuit having an input and an output, the input of the analog circuit coupled to the battery, and the output of the analog circuit coupled to a fourth signal input of the multiplexer; and a digital circuit coupled to the output of the ADC, the digital circuit stores correction parameters for correcting a converted battery voltage value from the ADC, the correction parameters including common mode voltage correction parameters, temperature correction parameters, and strain correction parameters associated with the first and second strain sensors.

16. The system of claim 15, wherein:
the ADC is configured to: for respective battery monitoring cycles, convert analog signals of the signal inputs of the multiplexer and provide respective converted values at the output of the ADC; and
the digital circuit is configured to: for a respective battery monitoring cycle, compute a corrected battery voltage value based on the converted battery voltage value, a first converted strain value associated with the first strain sensor, a second converted strain value associated with the second strain sensor, and a converted temperature value associated with the temperature sensor.

17. The system of claim 16, wherein:
the strain correction parameters include: a first set of strain correction parameters of a first strain temperature offset equation of second or higher order, a second set of strain correction parameters of second strain temperature offset equation of second or higher order, a set of weighting parameters of a weighted average equation, and a third set of strain correction parameters of a third strain temperature offset equation of second or higher order; and
the digital circuit is configured to, for the respective battery monitoring cycle:
compute a first strain offset value based on the first converted strain value and the converted temperature value using the first set of strain correction parameters and the first strain temperature offset equation,
compute a second strain offset value based on the second converted strain value and the converted temperature value using the second set of strain correction parameters and the second strain temperature offset equation,
compute a total stress value based on the first and second strain offset values using the set of weighting parameters and the weighted average equation,
compute a temperature corrected strain value based on the total stress value using the third set of strain correction parameters and the third strain temperature offset equation, and
compute the corrected battery voltage value based on the converted battery voltage value, the temperature corrected strain value, and the converted temperature value.

18. The system of claim 16, wherein:
the common mode voltage correction parameters include a common mode gain value and a common mode voltage value of a common mode correction equation;
the temperature correction parameters include a set of temperature correction parameters of a temperature correction equation of second or higher order;
the strain correction parameters include a strain correction constant of a strain correction equation; and
the digital circuit is configured to, for the respective battery monitoring cycle:
compute a common mode corrected value based on the converted battery voltage value using the common mode gain value, the common mode voltage value, and the common mode correction equation,
compute a temperature corrected value based on the converted temperature value and the common mode corrected value using the set of temperature correction parameters and the temperature correction equation,
compute a temperature corrected strain value based on the first converted strain value and the second converted strain value, and
compute the corrected battery voltage value based on the temperature corrected value using the temperature corrected strain value, the strain correction constant, and the strain correction equation.

19. The system of claim 15, wherein the digital circuit is configured to, for a respective battery monitoring cycle, compute a temperature corrected strain value based on a first converted strain value associated with the first strain sensor and a second converted strain value associated with the second strain sensor using a weighted average equation.

20. The system of claim 15, wherein the voltage reference circuit includes a bandgap reference.

* * * * *